United States Patent [19]
O'Connell

[11] Patent Number: 6,166,552
[45] Date of Patent: *Dec. 26, 2000

[54] METHOD AND APPARATUS FOR TESTING A SEMICONDUCTOR WAFER

[75] Inventor: Richard W. O'Connell, Austin, Tex.

[73] Assignee: Motorola Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/662,739

[22] Filed: Jun. 10, 1996

[51] Int. Cl.[7] .................................................. G01R 31/00
[52] U.S. Cl. ........................................ 324/754; 324/158.1
[58] Field of Search ...................... 324/758, 754, 324/757, 755, 761; 414/786; 33/572, 1 M; 248/124, 125.9

[56] References Cited

U.S. PATENT DOCUMENTS

| | | | |
|---|---|---|---|
| 4,665,360 | 5/1987 | Phillips | 324/72.5 |
| 4,742,980 | 5/1988 | Heigi | 248/125.9 |
| 4,943,020 | 7/1990 | Beaucoup et al. | 248/124.2 |
| 4,994,735 | 2/1991 | Leedy | 324/754 |
| 5,091,693 | 2/1992 | Berry et al. | 324/754 |
| 5,369,358 | 11/1994 | Metzger et al. | 324/754 |
| 5,436,571 | 7/1995 | Karasawa | 324/757 |
| 5,528,158 | 6/1996 | Sinsheimer et al. | 324/754 |
| 5,530,371 | 6/1996 | Perry et al. | 324/758 |
| 5,530,374 | 6/1996 | Yamaguchi | 324/754 |
| 5,600,258 | 2/1997 | Graham et al. | 324/758 |
| 5,606,262 | 2/1997 | Montalbano et al. | 324/758 |
| 5,821,764 | 10/1998 | Stocum et al. | 324/758 |
| 5,982,182 | 11/1999 | Chiu et al. | 324/754 |

FOREIGN PATENT DOCUMENTS 0 681 186 A2  11/1995  European Pat. Off. ........ G01R 1/073

*Primary Examiner*—Vinh P. Nguyen

[57] ABSTRACT

A probing apparatus includes a prober (210) and a test head (130) that includes a test head mother board (132). A load board 218 and a probe card (216) are connect to each other and the test head mother board (132) using conductive bumps (219). The need for a table top for the prober (210) and clamp ring are essentially eliminated. The direct docking of the test head mother board (132) to the probe card and load board assembly allows more reliable and shorter connections to be made. A tilt controller (324) and theta controller (624) allow fine adjustments to be made.

38 Claims, 4 Drawing Sheets

FIG. 1 —PRIOR ART—

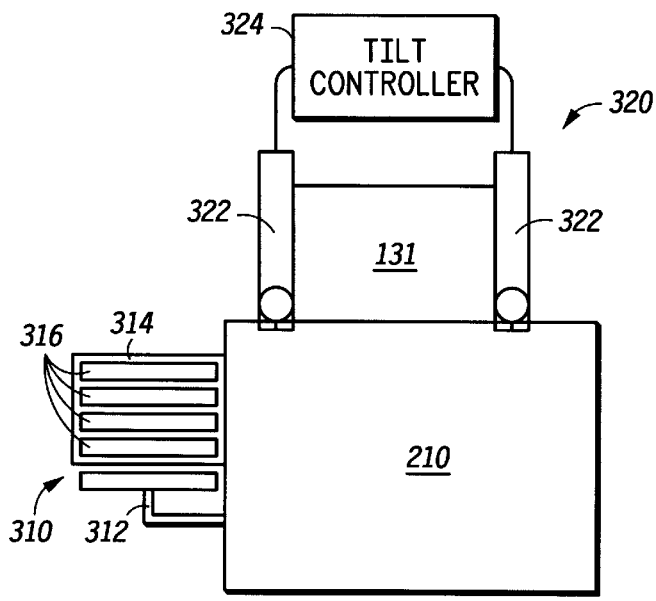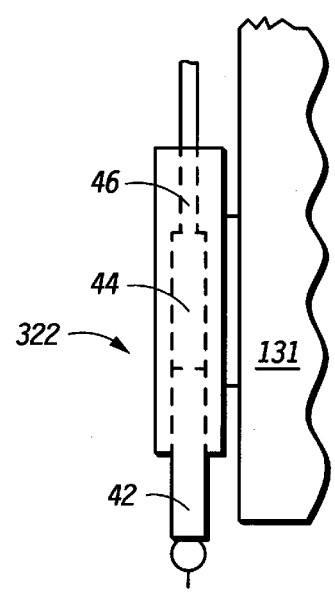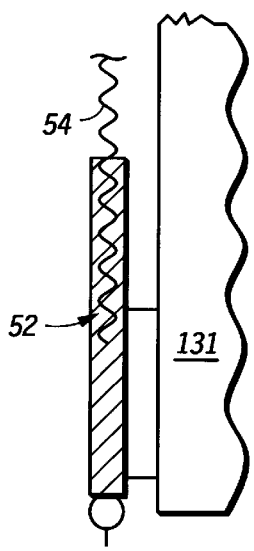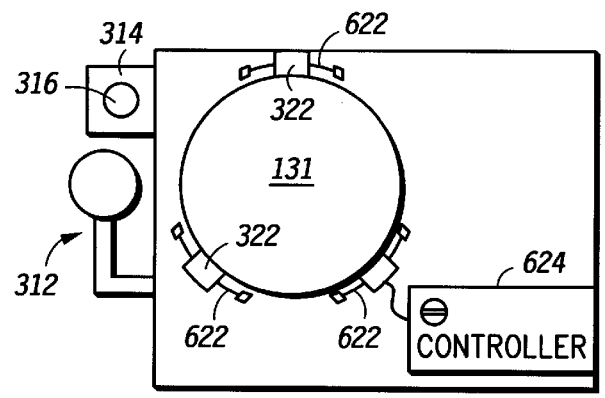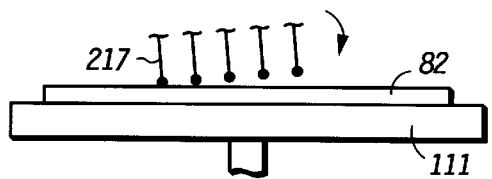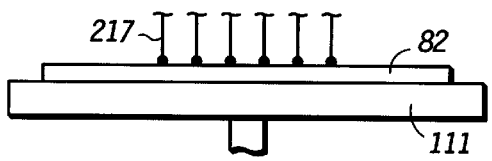

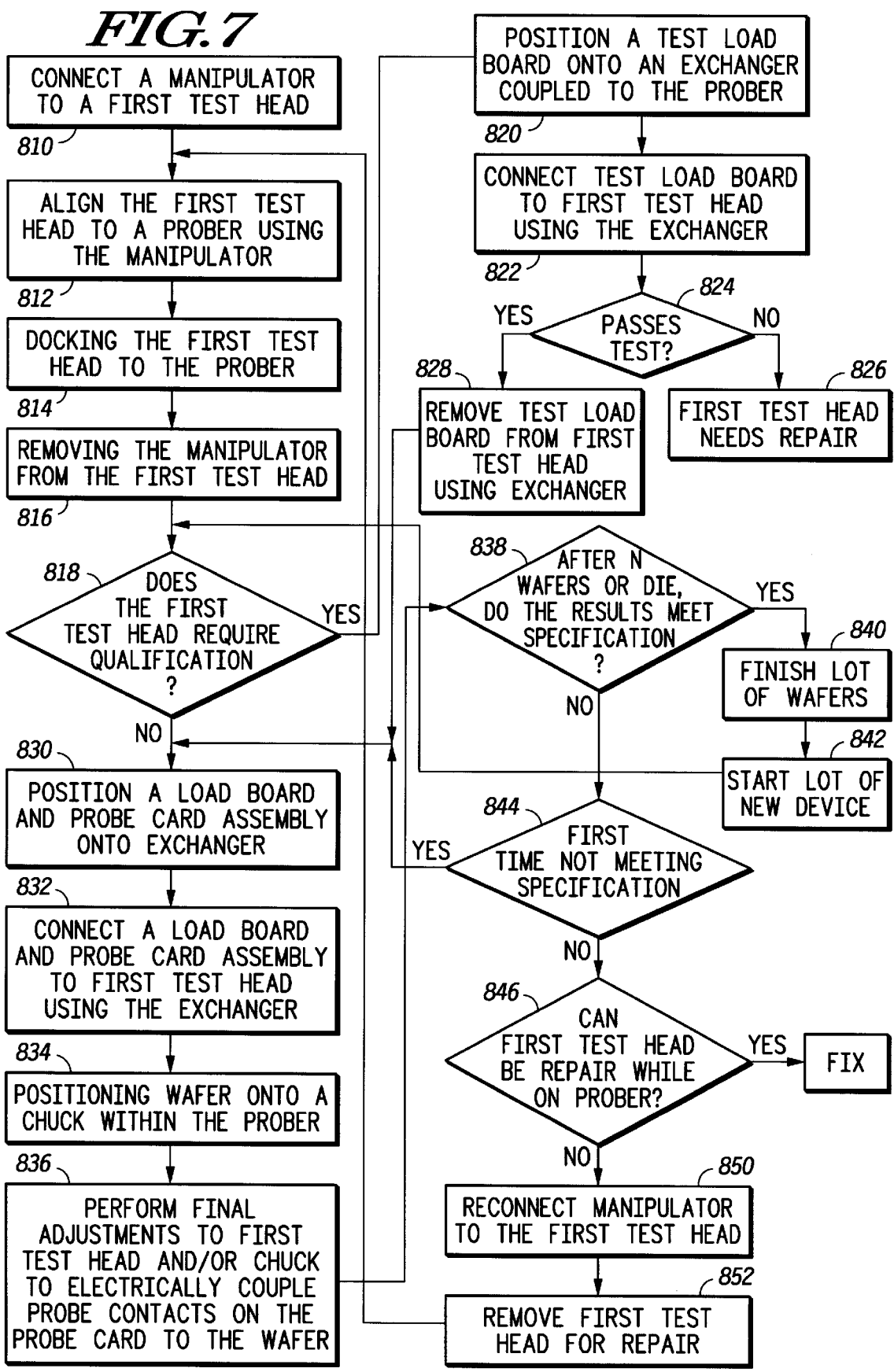

METHOD AND APPARATUS FOR TESTING A SEMICONDUCTOR WAFER

FIELD OF THE INVENTION

The present invention relates generally to semiconductor circuit manufacturing, and more particularly, to testing integrated circuits using wafer probe techniques.

BACKGROUND OF THE INVENTION

In the integrated circuit industry, many integrated circuits are manufactured simultaneously on a single integrated circuit wafer. A mechanism must be provided to allow for individual test probing of these integrated circuits before the circuits are diced individually from the wafer. FIG. 1 illustrates a prior art apparatus which is used to probe integrated circuits located on the semiconductor wafer.

FIG. 1 generally illustrates two sections of large equipment which are used together in the semiconductor industry to perform wafer probing. FIG. 1 illustrates both a portion of a prober 110 (which is a bottom portion of FIG. 1) and a test head 130 (which is a top portion of FIG. 1). The test head 131 contains a plurality of printed circuit boards 134. Printed circuit boards 134 contain all the necessary electrical circuitry which is required to test integrated circuits located on a wafer mounted on a chuck 111 in FIG. 1. FIG. 1 illustrates a test head mother board 132 which is a large printed circuit board that routes electrical connections for all of the individual boards 134 and physically supports the individual circuit boards 134. Mother board 132 is used to electrically route electrical test signals from the printed circuits boards 134 via pogo pins 119.

The top set of pogo pins 119 illustrated in FIG. 1 is coupled between the load board 118 and the mother board 132 within FIG. 1. Load board 118 is used to physical route electrical test signals from the circuit boards 134 to a physical format which allows for direct interfacing to a probe card 116. In some circumstances, the load board 118 may contain circuitry, such as capacitors or other integrated circuits, which aid or complement the test procedure. Probe card 116 is coupled to the load board 118 via a second set of pogo pins 119 as illustrated in FIG. 1. In another form, the bottom set of electrical connections 119 which couple the load board to the probe card may be male and female connectors instead of pogo pins.

The probe card 116 contains conductive traces which route electrical test signals from the load board to probe needles 117. The most common form of probe contactor used in the industry is referred to as the cantilever probe needle. A wafer chuck 111 is used to support an integrated circuit wafer during testing and is used to bring a semiconductor wafer into contact with the probe needles 117 via vertical (Z) axis motion. Once electrical contact is made between the probe needles 117 and the wafer on chuck 111, electrical testing of devices on the semiconductor wafer located on chuck 111 can be performed using signals transmitted from the printed circuit boards 134.

The test head 131 is mechanically coupled to the prober 110 via several elements which will be discussed below. FIG. 1 illustrates a table top 112 which is connected directly to the prober station 110. Table 112 is typically an inch thick and is made of cast iron. A ring carrier 114 is mounted to the table top 112 as illustrated in FIG. 1. The ring carrier 114 is also coupled to the electrical interconnect system of FIG. 1 as previously described. The ring carrier 114 is further contacted to a connection mechanism 120 as illustrated in FIG. 1. In one form, the connection mechanism 120 is a J-ring or a like structure. In all forms, a first portion of the connection mechanism 120 is connected to the ring carrier 114 and a second portion of the connection mechanism 120 is connected to the test head 131. These two portions of the connection mechanism 120 are brought into contact to form a mechanical connection between the test head 131 and the prober as is known in the art.

The apparatus in FIG. 1 has several disadvantages. In FIG. 1, an extensive number of pogo pins or like electrical contacting mechanisms are connected in series in order to provide control signals between test circuitry and wafers under test. These pogo pins have experimentally been shown to effect electrical signal integrity significantly and add extra delay to transmitted electrical signals. In addition, since pogo pins are mechanical in a way in which they operate, the pogo pins have a higher tendency to fail over time and may result in failed testing procedures which must subsequently be repeated.

In addition, the use of thicker pogo pins and the use of the connection mechanism 120, the ring carrier 114, and the table top 112, results in a substantial distance being formed between the wafer and chuck 111 and the printed circuit boards 134. As illustrated in FIG. 1, this distance from wafer 111 to the test head 130 is roughly 3.5 inches. Due to this large distance of 3.5 inches between the device under test (chuck 111) and the test circuitry which provides test conditions, high-speed test frequencies cannot be achieved for many modern semiconductor devices which are operating at or above 100 megahertz (MHz). In addition, the test head 131 can weigh as much as 400–500 pounds which creates stress problems in the table top 112 and ring carrier 114. New generations of test heads are expected to weigh even more than 400–500 pounds and will only exacerbate stress problems in the test system. When coupling a large mass such as test head 130 to a system using the connection mechanism 120, significant stress results in the electrical system illustrated in FIG. 1. These high stresses in the system of FIG. 1 result in lost yield, lack of test repeatability, and excessive wear.

In addition, since the connection mechanism 120 and table top 112 are utilized to connect the test head 131 to the wafer prober 110, subsequent test head 131 movement to align to various electrical connections is not possible in the system of FIG. 1. A complex and expensive manipulator is connected to the test head 131 to allow for docking of the test head 130 to the prober 110 as illustrated in FIG. 1. Typical manipulators in the industry have somewhere between 5 and 8 adjustments which need to be set rather precisely to result in proper electrical connection of the elements of FIG. 1. Since the manipulator requires several adjustments, a large amount of time is needed during set up before the apparatus of FIG. 1 will be rendered functional.

In addition, in the system of FIG. 1, it becomes necessary to remove the test head 131 in order to gain access to the printed circuit boards 134, the probe cards 116, the load board 118, or other devices within the prober or test head 131. Not only does this removal of the test head 131 require additional time, the removal of the test head requires subsequent re-docking which requires alignment to occur all over again. In addition, the interface between the test head 131 and the prober 110 is highly customized for each prober and each test head. Therefore, swapping between test heads and between probers is not an easy task in the integrated circuit industry and increases costs.

Therefore, the need exists for an improved apparatus for wafer probing semiconductor wafers.

BRIEF DESCRIPTION OF THE DRAWINGS

FIG. 3 includes an illustration of a portion of a testing assembly including a prober, a test head, an exchanging mechanism and a tilt controller in accordance with an embodiment of the present invention;

FIG. 4 includes a cross-sectional view of a portion of the test head assembly showing a pneumatic type of tilting adjustment system in accordance with an embodiment of the present invention;

FIG. 5 includes a cross-sectional illustration of a portion of a tilting assembly mechanism including a threaded opening and a worm gear in accordance with another embodiment of the present invention;

FIG. 6 includes a top view of the probe and test mechanism including the exchanger mechanism as well as rails for doing a rotational (θ) controller adjustment;

FIG. 7 includes a process flow diagram for one embodiment of the present invention;

FIG. 8 includes an illustration of probe tips contacting a substrate in a non-uniform manner; and FIG. 9 includes the prober of FIG. 8 after making a tilt adjustment.

Figure 1:
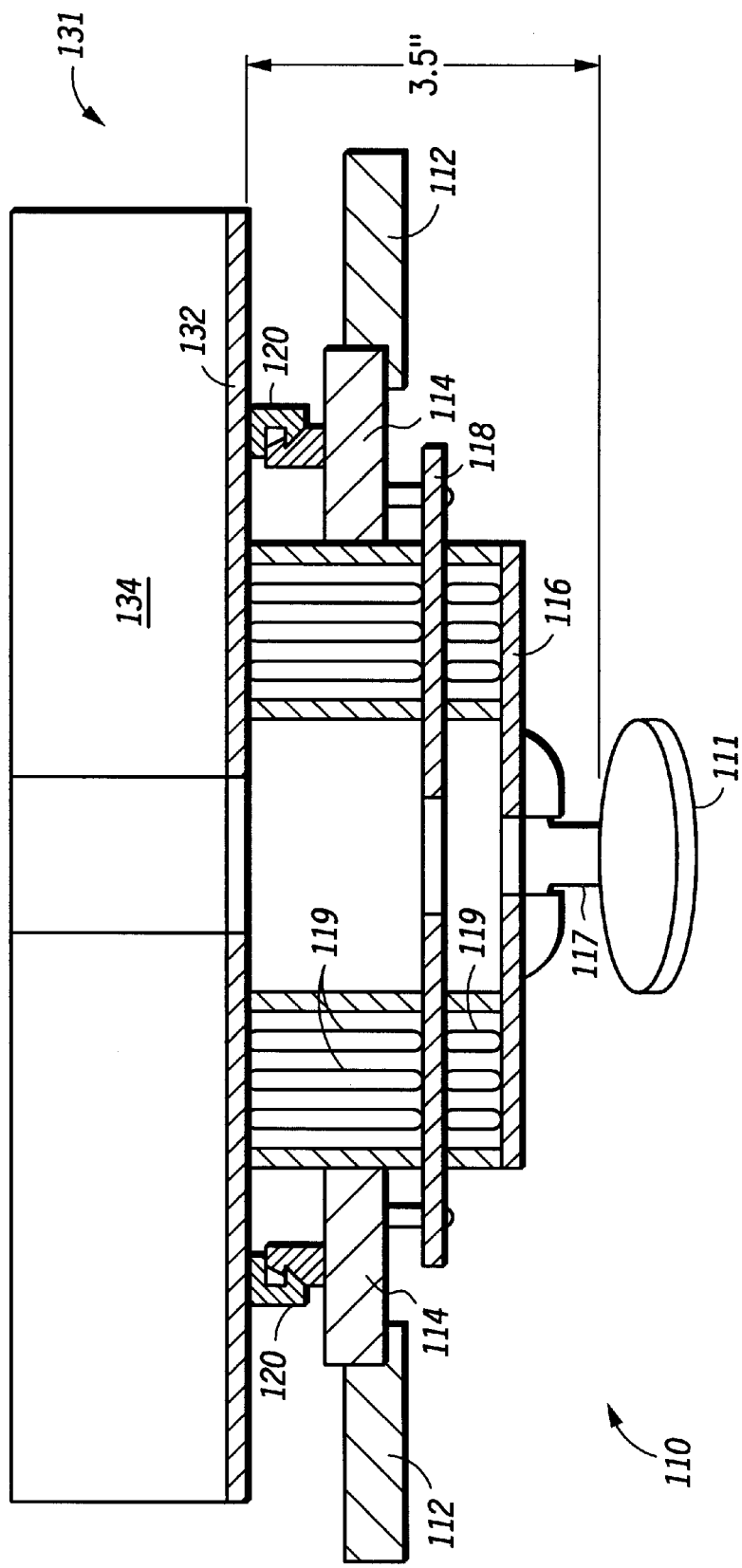
FIG. 1 includes a cross sectional illustration of a portion of a probe and test assembly (prior art)

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Figure 2:
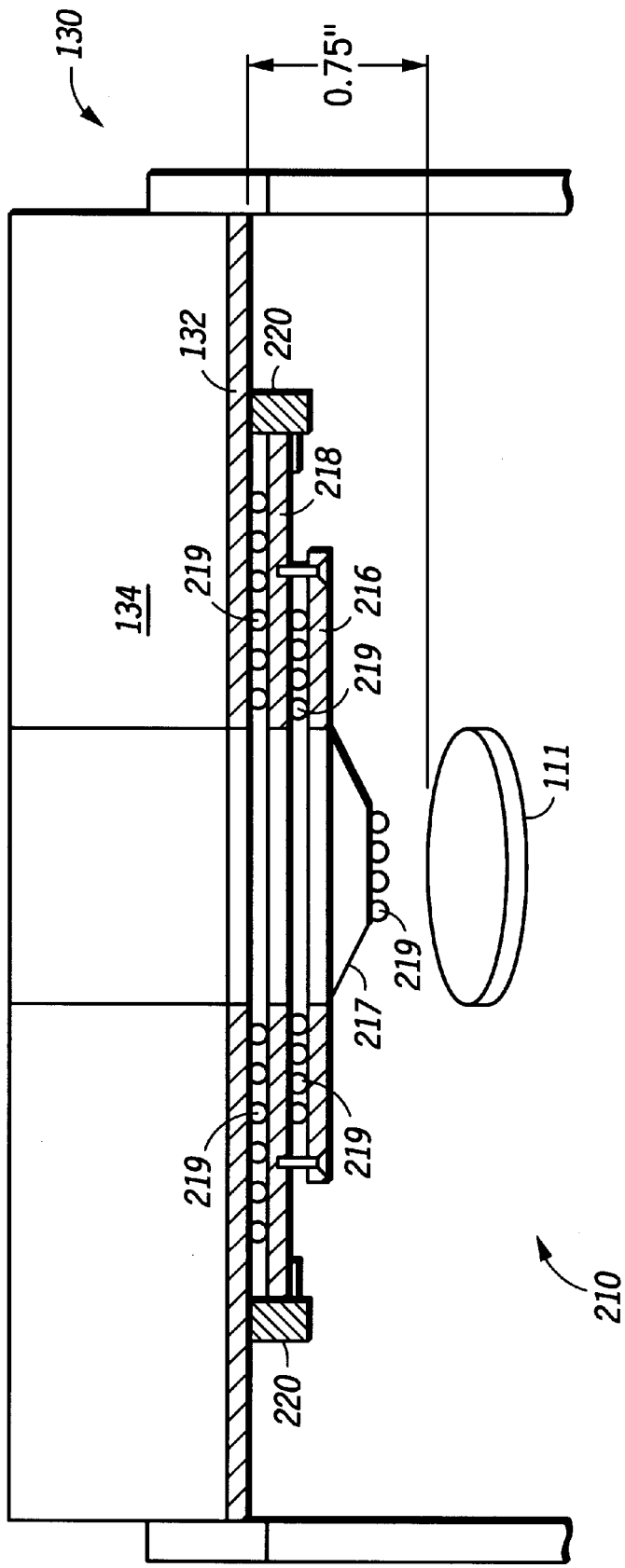
FIG. 2 includes a cross sectional illustration of a portion of a probe and testing apparatus including an embodiment of the present invention.

In general, FIG. 2 illustrates an improved apparatus over that illustrated in prior art FIG. 1. FIG. 2 illustrates a system which has decoupled the extreme mass of the test head 130 from any portion of a ring carrier and table top in order to eliminate test non-repeatability, reduce stresses, and increase a lifetime of the test parts illustrated in FIG. 2. In addition, the apparatus of FIG. 2 has significantly simplified the mechanical aspects of the electrical interconnects between the wafer 111 and the printed circuit boards 134. This simplified interconnection scheme also has advantages electrically as well as mechanically since the distance between the circuit boards 134 and the wafer 111 have been lessened which allows for higher signal frequency of operation and reduced signal reflection. A result is the tester illustrated in FIG. 2 can test integrated circuit wafers at speeds which far exceed that currently available to conventional probers and test heads.

Due to the fact that the probe card and the load board are docked directly to the test head, computer control can be used to change a position of the test head, load board, and probe card in FIG. 2 to better align the bottom set of contacts 219 in FIG. 2 to the wafer and chuck 111. This ability to perform self-leveling to align electrical contacts in the system of FIG. 2 also allows for the use of bump technology to connect various elements of FIG. 2. The use of bump technology further increases the test system performance both electrically and mechanically. Furthermore, the purchase price and maintenance cost for the device illustrated in FIG. 2 is significantly reduced over the conventional structure illustrated in FIG. 1. In general, a method and apparatus used for direct docking can greatly improve upon test cost and test performance.

The invention can be further understood with reference to FIGS. 2–9. FIG. 2 illustrates a test head 130 that is substantially similar to the test head 131 illustrated in FIG. 1 with the exception that the test head 130 has been changed to accommodate bump connection technology between the load board 218 and the mother board 132. Test head 130 contains a plurality of printed circuit boards 134 which are similar to the circuit boards discussed in FIG. 1. FIG. 2 also illustrates the test head mother board 132 which is a mother board similar to the one illustrated in FIG. 1 modified for bump connections. FIG. 2 differs significantly from FIG. 1 in the design and aspects of the electrical interconnect system and the mechanical docking system. The test head mother board 132 is coupled directly to a first set of conductive bumps 219. This first set of bump regions 219 are connected to load board 218. A clamping mechanism 220 is illustrated in FIG. 2 and allows for the load board 218 to be connected firmly to the mother board 132.

An exchanger or exchange system is coupled to the prober 210. The exchanger allows for the changing of both the load board 218 and the probe card 216 as a single unit (referred to together as a load board and probe card assembly 218 and 216). The removal of the load board and probe card assembly 216 and 218 is performed via manipulation of the clamping mechanism 220. Typically, clamping mechanism 220 is a pneumatic system which is activated or deactivated based upon computer control that interfaces with the exchanger. A probe card 216 is fastened to the load board 218 via screws (illustrated in FIG. 2) or a ring carrier (not illustrated in FIG. 2) to result in the integral load board and probe card assembly 216 and 218.

Electrical connections are made between load board 218 and probe card 216 via bump technology as illustrated via the conductive bumps 219 of FIG. 2. Element 217 is a polyimide membrane which supports a third/lowest set of conductive bumps (also illustrated as bumps 219) which directly overlie a wafer and chuck system 111. The portion 111 is part of the prober 210 and is used to support a semiconductor wafer under test.

The apparatus of FIG. 2 is improved over the apparatus of FIG. 1 for several reasons. First, the separation between the test head 130 and the wafer under test 111 is substantially less than 3.5 inches as illustrated in the prior art of FIG. 1. It is easy to obtain separations between the test head 130 and the wafer 111 which are less than 2.5 inches and nearly all configurations of the test system are easily able to achieve a test-head-to-device-under-test separation of less than 1.25 inches. In some cases, it is not unusual for a test system to be designed as illustrated in FIG. 2 wherein the test-head-to-device-under-test separation is less than 0.75 inches (and may optimally reach 0.5" or less). The apparatus of FIG. 2 has a load board and probe card assembly 218 and 216 which is inserted into the test system by an exchanger (see FIG. 3) and coupled directly to the test head 130 via computer control. Due to this feature, the test head 130 can be manipulated via computer controlled motor systems or a pneumatic system to result in computerized leveling of the lowest level of ball bonds 219 which are to contact to the wafer/chuck 111.

Due to the fact that the design of FIG. 2 is simplified and superior to that of FIG. 1 and results in fewer moving parts during the course of operation, increased up-time can be achieved. The use of an expensive and custom-designed manipulator which allows for multiple axis movement is unnecessary in the system of FIG. 2. In general, the manipulator required for controlling the test head 130 of FIG. 2 need only be a simply piece of machinery which clamps to a test head 130 and moves it away from the prober in the Z direction (vertical direction). The system of FIG. 2 allows for generic design of most testers and probers, and allows for different test heads and different probers to interface with one another with less difficulty.

As can be seen by comparing FIG. 1 to FIG. 2, the connection mechanism 120, the ring carrier 114, and the table top 112 have been totally eliminated from the design of FIG. 2. The removal of the mechanical parts allows for the printed circuit board 134 to be placed closer to the device under test (DUT) and allows for circuitry to be tested at speed within ranges of roughly 100 MHz and 400 MHz and higher as technology progresses. This ability allows for the speed sorting of individual die at wafer probe which reduces cost and increases cycle time. Specifically, speed sorting of high performance microprocessors can now be performed, and the speed sorting of high performance microprocessors was not available using the system of FIG. 1. The system of FIG. 2 also allows for more efficient set up since significant adjustments are not required in order to provide for proper electrical connection.

Therefore, in general, the apparatus of FIG. 2 is superior to the prior art apparatus of FIG. 1.

FIG. 3 illustrates the prober 210 which is docked to the test head 130. The test head 130 contains three kinematic coupling mechanisms 322. In general, the kinematic mechanism 322 is used to align the test head 130 with the prober 210 with one micron precision. A Z-axis direction of each of the three kinematic mechanisms 322 are controlled by a tilt controller computer 324. The operation of the tilt controller 324 is discussed in more detail in flow chart FIG. 7. After the test head 130 is docked with the prober 210, an exchanger system 310, which has an exchanger 312, is used to select a load board and probe card assembly from a magazine 314 which contains a plurality of load board and probe card assemblies 316. In another form, the magazine 314 may contain a load board and device test assembly which can be asserted into the probe 210 and test head 130 apparatus to verify operation of the test head 130. After the exchanger 312 has selected a probe card and load board assembly and placed the load board and probe card assembly in contact with the test head 130, wafers are provided to the prober 210. These wafers are serially brought into contact with the probe card of the load board and probe card assembly which is now mounted to the test head 130. Testing of the integrated circuits of the semiconductor wafers is then commenced so that the electrical circuits can be verified for proper operation.

FIGS. 4 and 5 illustrates two mechanisms which may be used to control the Z-axis position of the kinematic mechanisms 322. FIG. 4 illustrates a pneumatic system 322. The pneumatic system 322 comprises a gas hose 46, an air region 44, and a piston 42. Gas, pumped into the chamber 44 can be used to raise or lower a portion of the test head 130 to allow for proper electrical contact between the probe card and the device under test within the prober 210. In anther form, computer controlled motors can be used as illustrated in FIG. 5 to control the Z-axis motion of all three kinematic mechanisms 322 of FIG. 3. FIG. 5 illustrates threaded mechanical mechanisms 52 and 54 which allow for the raising and lowering of portions of the test head 130 in accordance with computer control via tilt controller 324. In general, the elements 322 are any devices which can allow for the test head 130 to be raised and lowered along any portion of its circumference to allow for proper leveling and electrical contact of the probe card with the underling semiconductor wafer.

FIG. 6 illustrates a top perspective view of the system illustrated in FIG. 3. FIG. 6 illustrates the test head 130. Test head 130 is coupled to three kinematic Z-axis control mechanisms 322 as illustrated in FIGS. 4 and 5. The Z-axis kinematic controls 322 are controlled via a theta controller 624 which allows for theta alignment and rotation of the test head 130. Therefore, between the theta controller 624 and the tilt controller 324, fine computer alignment of the test head 130 can be achieved. In one form, the tilt controller 324 and the theta controller 624 can be a same device Theta movement is possible via tracks 622 having stops which are located below each of the kinematic devices 322. The tracks 622 are configured so that one kinematic system is controlled by the theta controller. The other of the three kinematic systems need not be electrically coupled to the theta controller 624, but will move in response to directions from the theta controller 624 which is coupled to one kinematic system 322. FIG. 6 also illustrates the exchanger 312, the magazine 314, and the plurality of load board and probe card assemblies 316.

FIG. 7 includes a process flow diagram of a method of probing wafers using an embodiment of the present invention. In step 810, a manipulator and a first test head are connected to one another. The first test head is then aligned to the prober using the manipulator as illustrated in step 812 of FIG. 7. The first test head and the prober are docked to one another as illustrated in step 814. The manipulator is then removed from the first test head as illustrated in step 816. At this point in the process, a decision is made whether or not the first test head will require some sort of qualification in step 818. If qualification is required, a test load board is positioned onto an exchanger that is coupled to the prober in step 820. The test load board is then connected to the first test head using the exchanger in step 822. If the test load board does not pass the test in step 826, then the first test head needs to be repaired and the entire test head assembly will be turned over to maintenance. If the test passes, then the test load board is removed from the first test head using the exchanger in step 828.

A production load board and probe card assembly is positioned onto an exchanger in step 830 and is then connected to the first test head using the exchanger in step 832. A wafer is positioned onto a chuck within the prober in step 834. At this point, there will be one or more final adjustments that may need to be made to the first test head, the chuck, or both in step 836. These adjustments will be used to electrically couple the probe contacts on the probe card to the wafer. As previously explained with the apparatus description, a tilt controller can be used to control the tilt, or a theta controller can be used to adjust the rotational position of the test head itself. Other positioning mechanisms can be used, but are not described within this specification.

After making the final adjustments, N wafers or die are probed. N, as used in this specification, is any integer that can be 1 or higher. A decision needs to be made after probing the N wafers or die to determine whether the results meet the specifications in the step 838. These specifications can be too many opens, too many shorts, or other criteria that appear to be unusual for the typical device being probed. For example, if the wafer yield from a certain type of device is typically about 90% and after probing N wafers, the wafer yield is only 50%, the probing operation may be stopped to determine whether the wafers are defective or if something in the prober or test head assembly is wrong. If the specifications are met, then the probing will continue until another verification point is reached or the lot of wafers has been finished in step 840. At this point, another lot of wafers can be started which can either be of the same device or a new device. If a new device will be probed in step 842, the process will start at C, which is illustrated as step 818.

Referring to step 844, the course of action depends upon whether the specifications have not been met once or more than once. If the specifications have not been met only once, the process starts all over at point B in the process. If the specifications have not been met more than once, then the step 846 is them performed. The next decision that needs to be made is can the first head assembly be repaired while it is still on the prober in step 846. If yes, then the test head is fixed or other repairs can be done. If they cannot be done, then the manipulator is reconnected to the first test head in a step 850. The first test head is removed for repairs in a step 852.

As previously stated, one of the final adjustments that can be made is to the tilt assembly. An illustration of one method of using the tilt controller is shown in FIG. 8 and 9. As can be seen in FIG. 8, the probe contacts 217 have ends that do not lie along a plane parallel to the surface of the semiconductor wafer 82. The left-most probe contact 217 in FIG. 8 contacts the wafer 111 before any of the other contacts are made. As soon as this contact is sensed by the tester, then the tilt controller will adjust the position of the head, which will allow the test head to rotate such that all of the probe contacts 217 contact the semiconductor wafer 82 as shown in FIG. 9. As previously described with the apparatus, this sort of adjustment can be made using the pneumatic cylinders (FIG. 4) worm gear assemblies (FIG. 5), or the like.

The system used with the present invention is fairly flexible between test heads themselves. For example, one manipulator can be used for all of the different test heads within a probe area even though the test heads are different models or used on different probers. The capability of removing the manipulator may save space as well as equipment costs as the test heads may only need to be removed for maintenance reasons. They do not need to be removed when probe card and load board assemblies are exchanged, during system qualifications (quals) or change over's for different types of devices that will be tested.

While the present invention has been illustrated and described with referenced specific embodiments and materials, further modifications and improvements will occur to those skilled in the art. It is to be understood, therefore, that this invention is not limited to the particular forms illustrated and that is appended in the claims to cover all modifications that do not depart from the spirit and scope of this invention.

What is claimed is:

1. A method of testing semiconductor devices on a substrate comprising the steps of:
   placing a test head having a plurality of electrical contacts onto a prober;
   placing the substrate on a chuck; and
   adjusting, via computer control, a physical position of the test head while the substrate is on the chuck and the test head is on the prober to adjust a physical position of the test head until one or more of the plurality of electrical contacts make electrical contact to the substrate;
   rotationally adjusting the position of the test head relative to a top surface of the substrate to make the plurality of electrical contacts more parallel to a surface of the substrate while the test head is in the process of being to the substrate whereby electrical contact between the plurality of electrical contacts and the substrate is improved.

2. A method of testing semiconductor devices on a substrate comprising the steps of:
   placing a test head having a plurality of electrical contacts on a prober;
   placing a substrate onto a prober after the step of placing the test head;
   making an electrical connection between the substrate and at least one of the plurality of electrical contacts;
   rotationally adjusting the position of the test head relative to a top surface of the substrate during the step of making an electrical contact.

3. The method of claim 2 wherein the prober is a wafer prober and the step of placing the test head comprises:
   bringing the test head into close proximity with the wafer prober where the wafer prober is without a table top.

4. The method of claim 3 wherein the prober is a wafer prober and the step of placing the test head comprises:
   placing a load board and probe card assembly into an exchanger which is coupled to the wafer prober; and
   moving the exchanger to bring the load board and probe card assembly into direct contact with the test head to make electrical contact between the test head and the load board.

5. The method of claim 4 wherein substrate is a semiconductor wafer and the step of placing the substrate onto the prober includes placing the substrate onto a wafer chuck, the step of placing the substrate comprising:
   bringing the semiconductor wafer into contact with the probe card assembly to allow for testing of a plurality of integrated circuits on the semiconductor wafer.

6. The method of claim 5 wherein the step of moving further comprises:
   aligning the test head to the load board and probe card assembly using computer controlled motion of one of either the test head or the load board and probe card assembly.

7. The method of claim 5 wherein the step of bringing the semiconductor wafer into contact further comprises:
   adjusting the test head using computer control so that the load board and probe card assembly which is coupled to the test head contacts to all electrical contact test points of the semiconductor wafer within a Z-axis specified tolerance.

8. The method of claim 5 wherein the step of moving comprises:
   choosing the load board and probe card assembly from a plurality of possible load board and probe card assemblies which are located in magazine that is accessible using the exchanger.

9. The method of claim 5 wherein the step of moving comprises:
   moving a first load board and probe card assembly into contact with the test head when testing a first type of semiconductor wafer and moving a second load board and probe card assembly into contact with the test head when testing a second type of semiconductor wafer.

10. The method of claim 5 further comprises:
    removing at least one electrical test circuit board from the test head without removing the test head from contact with the load board and probe card assembly.

11. The method of claim 5 further comprises:
connecting a manipulator to the test head after the test head is brought into contact with the load board and probe card assembly wherein the manipulator is used to move the test head so that access to the test head can be obtained for repair purposes.

12. The method of claim 5 wherein the step of bringing a test head into close proximity with a wafer prober comprises:
using a manipulator connected to the test head to move the test head into close proximity to the wafer prober wherein the test head is brought in contact with a portion of the wafer prober; and
removing the manipulator from the test head when electrically testing the plurality of integrated circuits on the semiconductor wafer.

13. The method of claim 5 wherein the step of moving the exchanger to bring the load board and probe card assembly into direct contact with the test head comprises:
using conductive bump locations to make electrical contact between the test head and the load board within the load board and probe card assembly.

14. The method of claim 5 wherein the step of bringing the semiconductor wafer into contact with the probe card comprises:
using conductive bump locations to make electrical contact between the probe card and the semiconductor wafer.

15. The method of claim 5 wherein the step of bringing the semiconductor wafer into contact with the probe card assembly comprises:
bringing the semiconductor wafer to within 2.5" of the test head when testing the plurality of integrated circuits on the semiconductor wafer.

16. The method of claim 5 wherein the step of bringing the semiconductor wafer into contact with the probe card assembly comprises:
bringing the semiconductor wafer to within 1.0" of the test head when testing the plurality of integrated circuits on the semiconductor wafer.

17. The method of claim 5 wherein the step of bringing the semiconductor wafer into contact with the probe card assembly comprises:
testing the plurality of integrated circuits on the semiconductor wafer by transmitting test signals through the test head, load board, and probe card assembly at a frequency of greater than 125 MHz.

18. The method of claim 5 wherein the step of bringing the semiconductor wafer into contact with the probe card assembly comprises:
testing the plurality of integrated circuits on the semiconductor wafer by transmitting test signals through the test head, load board, and probe card assembly at a frequency of greater than 200 MHz.

19. The method of claim 2 wherein the step of placing the test head comprises:
using an exchanger to place a first load board and probe card assembly into contact with a test head which is in contact with the prober;
and wherein the substrate is a first semiconductor wafer, wherein the step of placing the substrate comprises:
bringing the first semiconductor wafer into contact with the first load board and probe card assembly which is within the prober.

20. The method of claim 19 further comprising:
using the exchanger to remove the first load board and probe card assembly from contact with the test head; and
using the exchanger to place a second load board and probe card assembly into contact with the test head which is in contact with the prober.

21. The method of claim 20 further comprising:
bringing a second semiconductor wafer into contact with the second load board and probe card assembly which is within the prober.

22. The method of claim 20 further comprising:
using the second load board and probe card assembly to test an operation of the test head.

23. The method of claim 20 wherein the at least one of the steps of using comprises:
using the exchanger to remove or place the one of either the first or second load board and probe card assembly into a magazine accessible by the exchanger wherein the magazine is designed to hold a plurality of load board and probe card assemblies.

24. The method of claim 20 wherein the at least one of the steps of using comprises:
using the exchanger to remove or place the one of either the first or second load board and probe card assembly into a magazine accessible by the exchanger wherein the magazine is designed to hold a plurality of load board and probe card assemblies.

25. The method of claim 20 wherein the at least one of the steps of using comprises:
keeping the test head in place and in contact with a surface of the prober when moving at least one of either the first or second load board and probe card assembly.

26. The method of claim 2, wherein the plurality electrical contacts are associated with a mother board of the test head.

27. The method of claim 2, further comprising a step of:
coupling probe contacts to the test head, wherein the probe contacts are directly overlying the substrate.

28. The method of claim 27, wherein the step of coupling probe contacts includes coupling a load board and probe card to the test head, wherein the probe card includes the probe contacts.

29. The method of claim 27, wherein the step of coupling probe contacts to the test head occurs after the step of placing the test head onto the prober and before the step of making the electrical connection.

30. The method of claim 27, wherein
the step of rotationally adjusting includes rotationally adjusting the position of the test head relative to a first portion of a top surface to allow for adequate electrical contact between the probe contacts and a first set of one or more integrated circuits on the substrate; and
the method further comprises the steps of:
probing the first set; and
rotationally adjusting the position of the test head relative to a second portion of a top surface to allow for adequate electrical contact between the probe contacts and a second set of one or room integrated circuits on the substrate.

31. The method of claim 27, wherein the step of rotationally adjusting comprises:
moving the substrate towards the test head until at least one probe contact of the is sensed as contacting a conductive contact point on the substrate; and
leveling the test head to achieve co-planarity between the substrate and probe contacts after the step of moving the substrate so that more than the at least one electric contact point are electrically coupled to the substrate.

32. The method of claim 31 wherein the step of leveling comprises:

leveling while the at least one probe contact is in contact with the conductive contact point on the substrate.

33. The method of claim 27 wherein the step of rotationally adjusting comprises.

adjusting the probe contact to the substrate by using three connection points between the test head and the prober.

34. The method of claim 2, wherein the step of rotationally adjusting further includes rotationally adjusting the position of the test head via computer control.

35. The method of claim 2, wherein the step of rotationally adjusting further includes rotationally adjusting the position of the head relative to the top surface of the substrate to make the probe contacts more parallel to a surface of the substrate.

36. The method of claim 2, wherein the step of rotationally adjusting further includes rotationally changing the position of the test head relative to the top surface of the substrate by changing a position of at least one of three kinematic docking points between the test head and the prober.

37. The method of claims 36, wherein the step rotationally adjusting further includes using a computer to instruct the at least one of the three kinematic docking points to extend or retract in the vertical axis direction.

38. The method of claim 36, wherein the step of rotationally adjusting further includes using one of motors and or pneumatic devices to control the motion of the at least one of the three kinematic docking points.

* * * * *

UNITED STATES PATENT AND TRADEMARK OFFICE
CERTIFICATE OF CORRECTION

| | |
|---|---|
| PATENT NO. | : 6,166,552 |
| DATED | : December 26, 2000 |
| INVENTOR(S) | : Richard W. O'Connell |

It is certified that error appears in the above-identified patent and that said Letters Patent is hereby corrected as shown below:

Column 10,
Line 59, change "room" to -- more --

Column 12,
Line 7, after "step", add -- of --

Signed and Sealed this

Sixteenth Day of December, 2003

JAMES E. ROGAN
*Director of the United States Patent and Trademark Office*